US006791415B2

(12) United States Patent
Mitteregger

(10) Patent No.: US 6,791,415 B2
(45) Date of Patent: Sep. 14, 2004

(54) INTEGRATED CIRCUIT ARRANGEMENT WITH A TRANSCONDUCTANCE AMPLIFIER

(75) Inventor: Gerhard Mitteregger, Taufkirchen (DE)

(73) Assignee: Xignal Technologies AG, Unterhaching (DE)

( * ) Notice: Subject to any disclaimer, the term of this patent is extended or adjusted under 35 U.S.C. 154(b) by 65 days.

(21) Appl. No.: 10/326,491

(22) Filed: Dec. 19, 2002

(65) Prior Publication Data

US 2003/0146789 A1 Aug. 7, 2003

(30) Foreign Application Priority Data

Dec. 28, 2001 (DE) .......................................... 101 64 382

(51) Int. Cl.⁷ ................................................. H03F 3/45
(52) U.S. Cl. ...................................... 330/260; 330/253
(58) Field of Search ................................ 330/253, 254, 330/260

(56) References Cited

U.S. PATENT DOCUMENTS

| | | | | |
|---|---|---|---|---|
| 5,404,097 A | * | 4/1995 | Barou ......................... | 330/260 |
| 5,451,901 A | | 9/1995 | Welland ...................... | 330/133 |
| 5,510,738 A | * | 4/1996 | Gorecki et al. ............. | 330/260 |
| 5,999,052 A | * | 12/1999 | Tang ........................... | 330/253 |

FOREIGN PATENT DOCUMENTS

| | | |
|---|---|---|
| DE | 690 26 858 T2 | 12/1996 |
| EP | 0 388 802 B1 | 5/1996 |

* cited by examiner

*Primary Examiner*—Khanh Van Nguyen
(74) *Attorney, Agent, or Firm*—Pearne & Gordon LLP

(57) ABSTRACT

The invention pertains to an integrated circuit arrangement, in particular, in accordance with the CMOS technology, with at least one transconductance amplifier (1) in order to generate a current signal (outp, outm) from an input voltage signal (inp-inm), wherein the transconductance amplifier consists of a first transconductance stage (gm1) and a second transconductance stage (gm2) that are connected in parallel, wherein the first transconductance stage (gm1) has a transconductance that is essentially defined by an ohmic resistance and the second transconductance stage (gm2) has an adjustable transconductance that is essentially defined by a transistor arrangement, and wherein the transconductance of the first transconductance stage (gm1) is higher than the transconductance of the second transconductance stage (gm2).

The highly linear transconductance amplifier that can also be adjusted in an infinitely variable fashion is, according to one preferred application, utilized in a continuous-time active filter, e.g., a Gm/C filter, in which a capacitor stage for integrating the output signal is arranged at the output of the transconductance amplifier.

15 Claims, 6 Drawing Sheets

INTEGRATED CIRCUIT ARRANGEMENT WITH A TRANSCONDUCTANCE AMPLIFIER

BACKGROUND OF THE INVENTION

1. Field of the Invention

The present invention pertains to an integrated circuit arrangement, in particular, in-accordance with the CMOS technology, with a transconductance amplifier.

Transconductance amplifiers that are also referred to as "Operational Transconductance Amplifiers" (OTA), transconductance elements or transconductors are devices for generating a current signal from an input voltage signal. The following applies if the input voltage is symbolized by vin and the output current is symbolized by iout:

$$iout = Gm \times vin$$

wherein Gm symbolizes the so-called transconductance gain or simply the transconductance of the device.

2. Description of the Prior the Art

A non-linearity of the transconductance amplifier, at which the transconductance depends on the input voltage, frequently causes problems in practical applications. Transconductance amplifiers may, similar to operational amplifiers (op amps), be operated in the feedback mode in order to decisively define the overall characteristics of the device by the external feedback wiring and to largely compensate this non-linearity. The reduction of the useful signal bandwidth associated with a feedback is, in particular, unacceptable for numerous applications.

A highly linear transconductance is achieved with a transconductance amplifier, the transconductance of which is essentially defined by an ohmic resistance, wherein the input voltage is applied to this resistance and the current flowing through the resistance defines the output current. A transconductance amplifier of this type is, for example, known from U.S. Pat. No. 5,451,901. However, it is disadvantageous in numerous applications that the highly linear transconductance defined by the resistance cannot be varied in such a "resistance-based" transconductance device. It would, for example, be conceivable to connect additional resistances in parallel by means of transistors in a device of this type. However, the transistors used lead to parasitic capacitances and an increased non-linearity or to a reduction of the maximum attainable input voltage excursion at a predetermined linearity requirement.

In the practical utilization of transconductance amplifiers in integrated circuit arrangements, one also needs to take into account that transconductances can vary significantly due to fluctuations in the manufacturing process, with the transconductances also varying with the temperature during the operation of the circuit arrangement. These are the reasons why an optional trimming or adjustment of transconductances (or an optional compensation of transconductance changes) is desirable and frequently even necessary.

In order to adjust the transconductance, it is, for example, possible to utilize a transconductance device, the transconductance of which is essentially defined by a transistor arrangement, wherein the transformation of the voltage signal into a current signal is realized by means of transistors (bipolar or MOS). In this case, the inherent transconductances of the transistors are utilized, wherein these transconductances are adjusted in the form of a corresponding shift of the operating point. Transconductance amplifiers of this type are also known from initially cited U.S. Pat. No. 5,451,901. The relatively low linearity of such a "transistor-based" device is disadvantageous or unacceptable in numerous applications.

A parallel connection of several controlled, identically configured transconductance stages is known from German patent DE 690 26 858 T2 (translation of European patent EP 0 388 802 B1). In this case, the inputs of the transconductance stages are connected to one another, and the outputs of the transconductance stages are connected to one another. The parallel connection serves for increasing the current capacity on the output side.

SUMMARY OF THE INVENTION

The present invention is based on the objective of eliminating the above-mentioned disadvantages and, in particular, developing a transconductance amplifier, as well as integrated circuit arrangements provided with such a transconductance amplifier, in which the transconductance is highly linear, but still adjustable.

This objective is attained with an integrated circuit arrangement according to claim 1. The dependent claims pertain to advantageous additional developments of the invention.

The basic idea of the invention consists of combining the high linearity achieved with resistance-based transconductance devices with the adjustability achieved with transistor-based devices. According to the invention, this combination is realized in the form of a parallel connection of a resistance-based transconductance stage and a transistor-based transconductance stage. In order to advantageously limit the non-linearity associated with the utilization of the transistor-based transconductance stage, the invention also proposes that the resistance-based transconductance is higher than the transistor-based transconductance, preferably by at least a factor of 2, in particular, by at least a factor of 5.

Consequently, the invention provides an integrated circuit arrangement with a transconductance amplifier, the transconductance of which is highly linear and simultaneously adjustable. This means that a conflict (linearity and adjustability) can be easily solved such that the performance characteristics of integrated circuit arrangements can be drastically improved in numerous applications.

A transconductance amplifier that is realized as described above is, according to one preferred application, utilized in a continuous-time active filter, e.g., a so-called Gm/C filter, in which a capacitor stage for integrating the output signal is arranged at the output of the transconductance amplifier, wherein said capacitor stage consists, for example, of two capacitors that respectively connect one of two output terminals of the transconductance amplifier to a reference potential (e.g., the ground or a supply potential).

According to one preferred and even more specialized application, the invention is utilized in continuous-time sigma-delta analog/digital converters (ADCs) that, according to the invention, may be realized for high signal bandwidths with a high signal-to-noise ratio, namely in a fully integrated fashion in accordance with the CMOS technology. In such ADCs, the filter characteristics may, for example, be roughly tuned by correspondingly switching on or off integration capacitors (trimming). In this case, the fine-tuning may be realized by adjusting the transistor-based transconductance, in particular, by adjusting at least one current flowing through a transistor channel (in bipolar transistors: emitter-collector path). In order to prevent an excessively large number of rough-tuning stages for adjustable filters, the fine-tuning range should not be excessively small. In applications that are particularly interesting for the invention, this can be achieved if the nominal transconductance (e.g., an average value of the minimum and the maximum transconductance) of the transistor-based transconductance stage is lower than the transconductance of the resistance-based transconductance stage by no more than a factor of 100.

In an integrated circuit arrangement with such a filter, an adjusting device for the automatic chip-integrated tuning of filter characteristics is preferably provided. Such devices and methods for tuning a filter are generally known and may, according to the invention, be advantageously utilized for adjusting the transconductance. In one such method, the current filter performance characteristics are, for example, measured and then compared with a standard (reference). Subsequently, the deviation between the current performance characteristics and the reference is determined, and a correction signal is ultimately calculated and fed to the filter in order to reduce the deviation (error), wherein this method is carried out iteratively. This method may be carried out directly on the filter or indirectly on a replica of the filter or parts of the filter in order to obtain filter characteristics to be measured during the adjustment of the filter.

According to one embodiment, a fully differential, in particular, symmetrically configured transconductance amplifier is provided as disclosed in claim 2.

A particularly simple configuration of a transconductance stage is achieved with the characteristics of claim 3. If the resistance-based transconductance stage and the transistor-based transconductance stage are realized in this fashion, parallel current sources naturally may be combined, i.e., considered as and realized in the form of a single current source, due to the parallel connection of these transconductance stages. If the resistance-based transconductance stage is realized in this fashion, the transistors on the input side may, in particular, be arranged as described in claim 4 and/or the transistors on the input side may be operated as described in claim 5.

With respect to a particularly simple design of the transistor-based transconductance stage, as well as its adjustability, it is advantageous to take the measures disclosed in claims 6 and 7, respectively. In this case, it is preferred to realize the transistors on the input side, as well as the transistor pair, in the form of MOS-FETs.

The current sources of the transconductance amplifier may be simply realized in accordance with claim 8, wherein a cascode transistor may be provided for increasing the output impedance. If a pair of sources is used, it is possible to provide a fully differential operational amplifier in this case in order to improve the performance characteristics of the current sources ("gain-boosting").

DESCRIPTION OF PREFERRED EMBODIMENTS

The invention is described in greater detail below with reference to the embodiments that are illustrated in the figures.

Figure 1:
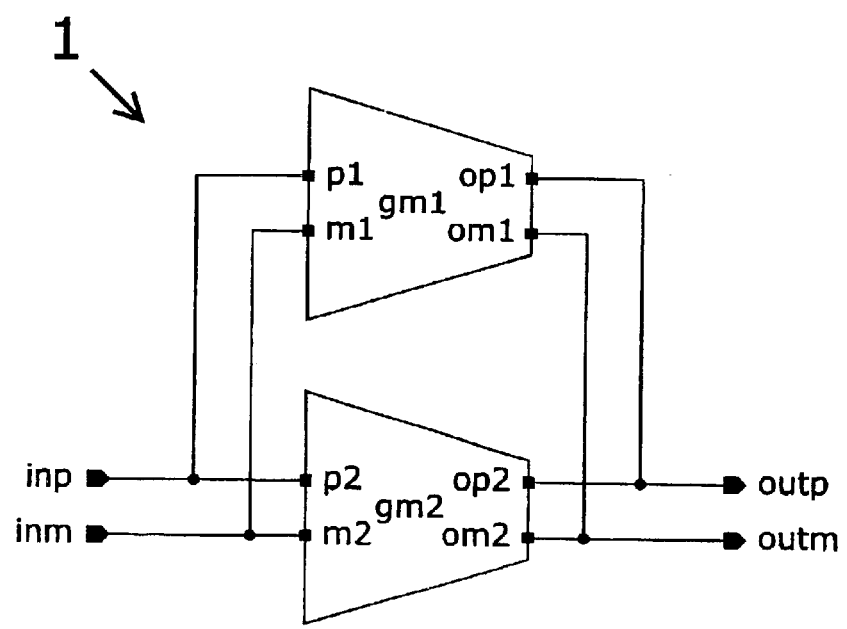
FIG. 1 shows a schematic block diagram of a transconductance amplifier.

FIG. 1 shows a transconductance amplifier 1 for generating a current signal outp, outm from an input voltage signal inp, inm.

The transconductance amplifier 1 is formed by a parallel connection of a first, resistance-based transconductance stage gm1 and a second, transistor-based transconductance stage gm2 as shown in FIG. 1. Input terminals p1, m1 of the first stage gm1 are respectively connected to one of the input terminals p2, m2 of the second stage gm2, and the output terminals op1, om1 of the stage gm1 are respectively connected to one of the output terminals op2, om2 of the stage gm2.

The transconductance of the resistance-based stage gm1 is nominally higher than the transconductance of the transistor-based stage gm2 by approximately a factor of 10 such that the output signal at op1, om1 of the stage gm1 provides a correspondingly greater contribution to the output signal outp, outm of the amplifier 1 than the output signal at op2, om2 of the stage gm2. Since the stage gm1 has an extremely high linearity, the output signal outp, outm is also highly linear. The adjustability of the transconductance of the stage gm2 simultaneously ensures that the transconductance of the amplifier 1 can be fine-tuned in an infinitely variable fashion (e.g., +/−10%)

The transconductance amplifier 1 shown in FIG. 1 represents a functional element of an integrated circuit arrangement that is manufactured in accordance with the CMOS technology and in which all transistors described below are realized in the form of MOS transistors.

Figure 2:
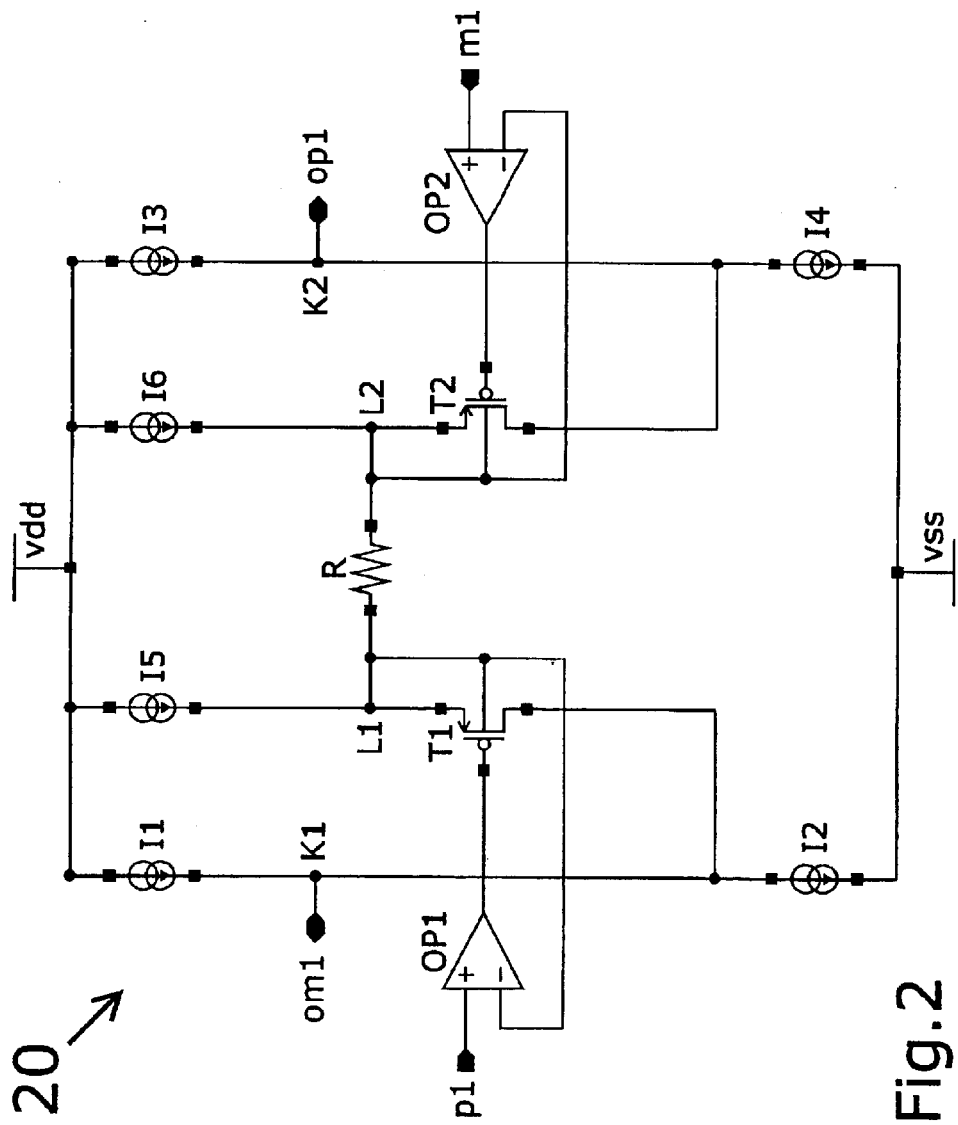
FIG. 2 shows a schematic circuit diagram of a resistance-based transconductance stage for use in the transconductance amplifier according to FIG. 1.

FIG. 2 shows an embodiment of a resistance-based and symmetrically configured transconductance stage 20 that, for example, may form the stage identified by the reference symbol gm1 in FIG. 1.

The stage 20 that is connected between a first supply potential vdd and a second supply potential vss comprises a pair of current paths on the output side which are respectively realized in the form of serial connections of two current sources I1, I2 and I3, I4 on the output side with respective output nodes K1, K2 situated in between and respectively connected to one of the output terminals op1, om1.

These output nodes K1, K2 are also connected to the supply potential vdd via one respective current path on the input side, wherein these current paths on the input side are, beginning at this supply potential vdd, respectively realized in the form of a serial connection of a current source I5 and I6 on the input side and one channel of a transistor T1 and T2 on the input side with respective input notes L1 and L2 situated in between. These input nodes L1, L2, as well as substrate connections of the transistors T1, T2, are connected by means of an ohmic resistance R.

In the stage 20, a first terminal of the resistance R is connected to the input node L1 and a channel terminal (source) of the transistor T1, and a second terminal of the resistance R is connected to the input node L2 and a channel terminal (source) of the transistor T2.

The stage 20 comprises a pair of isolation amplifiers that, with the addition of the transistors T1, T2, are realized in the form of regenerative operational amplifiers OP1, OP2 in order to operate the control terminals (gates) of the transistors T1, T2 independently of the input potentials inp, inm applied to p1, m1 and to apply the input potentials inp, inm to the input nodes L1, L2.

In the stage 20, the current sources I1–I6 are suitably adapted to one another. A voltage signal (vin) provided as a potential difference between inp and inm at the input of the stage 20 leads to a highly linear current signal outp, outm (iout) at the output, wherein the transconductance is essentially defined by the value of the ohmic resistance R.

Figure 3:
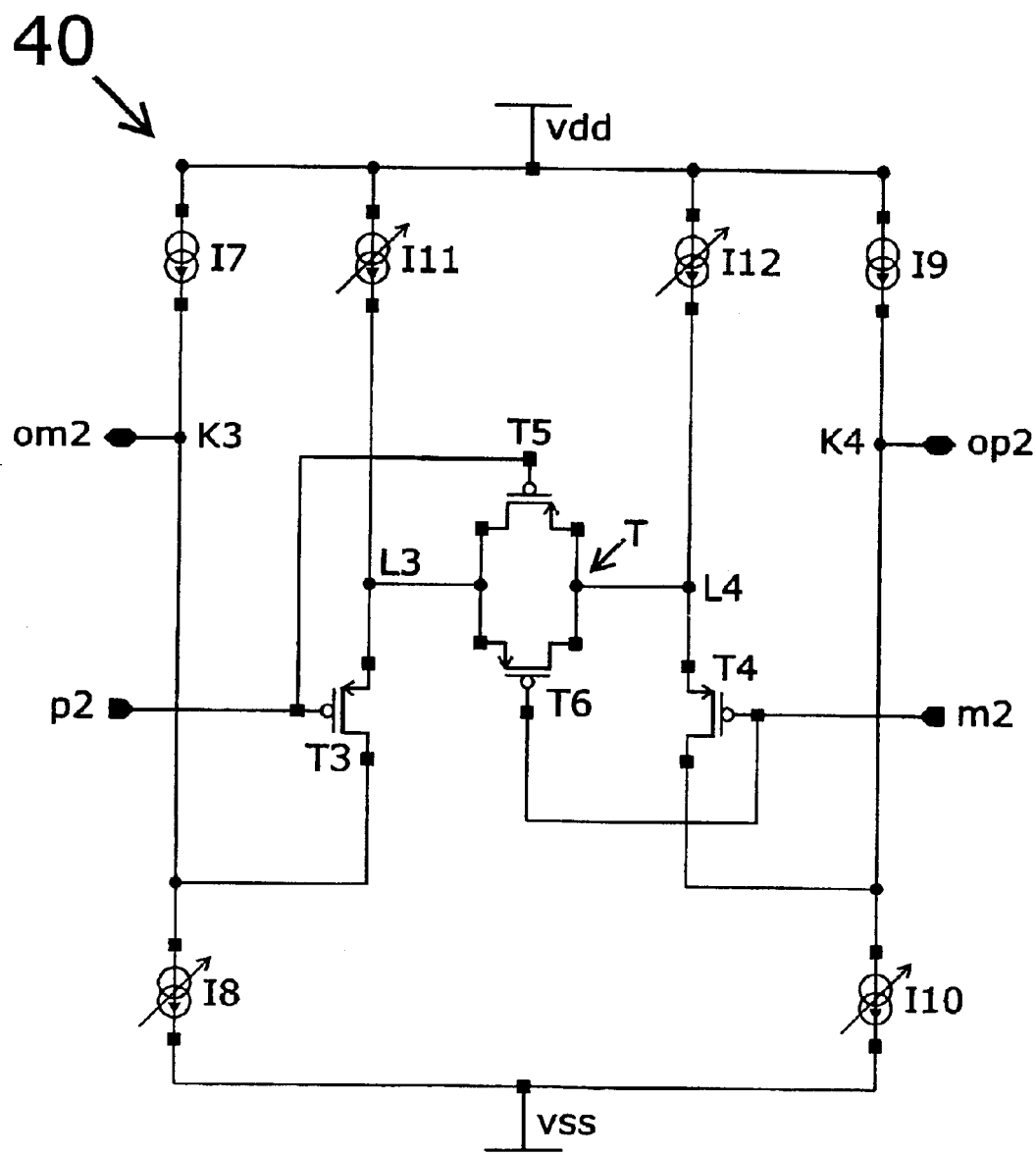
FIG. 3 shows a schematic circuit diagram of a transistor-based transconductance stage for use in the transconductance amplifier according to FIG. 1.

FIG. 3 shows an embodiment of a transistor-based and symmetrically configured transconductance stage 40 that, for example, may form the stage identified by the reference symbol gm2 in FIG. 1.

The stage 40 that is connected between a first supply potential vdd and a second supply potential vss comprises a pair of current paths on the output side which are respectively realized in the form of a serial connection of two current sources I7, I8 and I9, I10 with respective output nodes K3, K4 situated in between and respectively connected to one of the output terminals op2, om2.

These output nodes K3, K4 are also connected to the supply potential vdd via one respective current path on the input side, wherein these current paths on the input side are, beginning at this supply potential vdd, respectively realized in the form of a serial connection of a current source I11 and I12 on the input side and one channel of a transistor T3 and T4 on the input side with respective input nodes L3 and L4 situated in between. These input nodes L3, L4, as well as control terminals (gates) of the transistors T3, T4, are coupled via a transistor arrangement T comprising transistors T5, T6.

In the stage 40, the input potentials inp, inm present at p2, m2 are directly applied to the control terminals of the transistors T3, T4.

A voltage signal (vin) provided as a potential difference between inp and inm at the input of the stage 40 leads to an approximately linear current signal outp, outm (iout) at the output, wherein the transconductance is defined by the characteristics of the transistors T3, T4 and the transistor arrangement T.

In contrast to the stage 20 shown in FIG. 2, the transconductance of the stage 40 shown in FIG. 3 is essentially defined by the transistor arrangement T. These transistors T5, T6 are arranged in the form of a transistor pair that is connected in parallel and in which a first common channel terminal is connected to the input node L3 and the other common channel terminal is connected to the input node L4. The control terminals of the transistors T5, T6 are connected to the control terminals of the transistors T3, T4 on the input side.

In the stage 40, the current sources I11, I8 are adjustable and the current sources I12, I10 are correspondingly adjustable in order to vary the currents flowing through the channels of the transistors T3 and T4 thusly adjust a desired transconductance.

Figure 4:
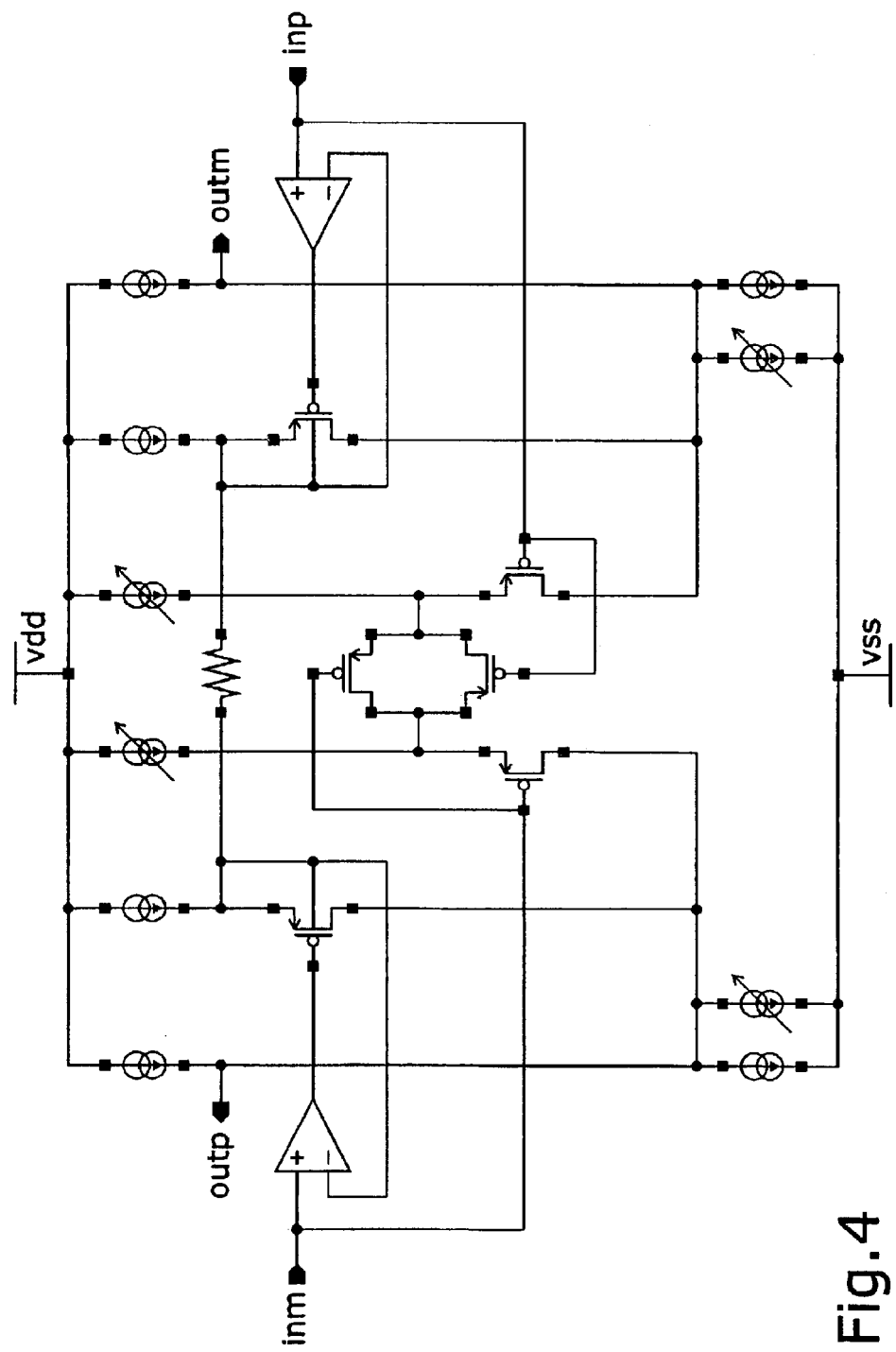
FIG. 4 shows a schematic circuit diagram of one embodiment of the transconductance amplifier according to FIG. 1.

FIG. 4 shows a detailed representation of one embodiment of the transconductance amplifier 1 according to FIG. 1, wherein said transconductance amplifier is realized in the form of a combination of the transconductance stages 20 (FIG. 2) and 40 (FIG. 3). In this case, the current sources I1, I3 of the stage 20 and the current sources I7 and I9 of the stage 40 are combined into a single current source as shown in FIG. 4. In other respects, the components shown in FIG. 4 correspond to the components of the above-described transconductance stages 20 and 40 with respect to their configuration and function.

Figure 5:
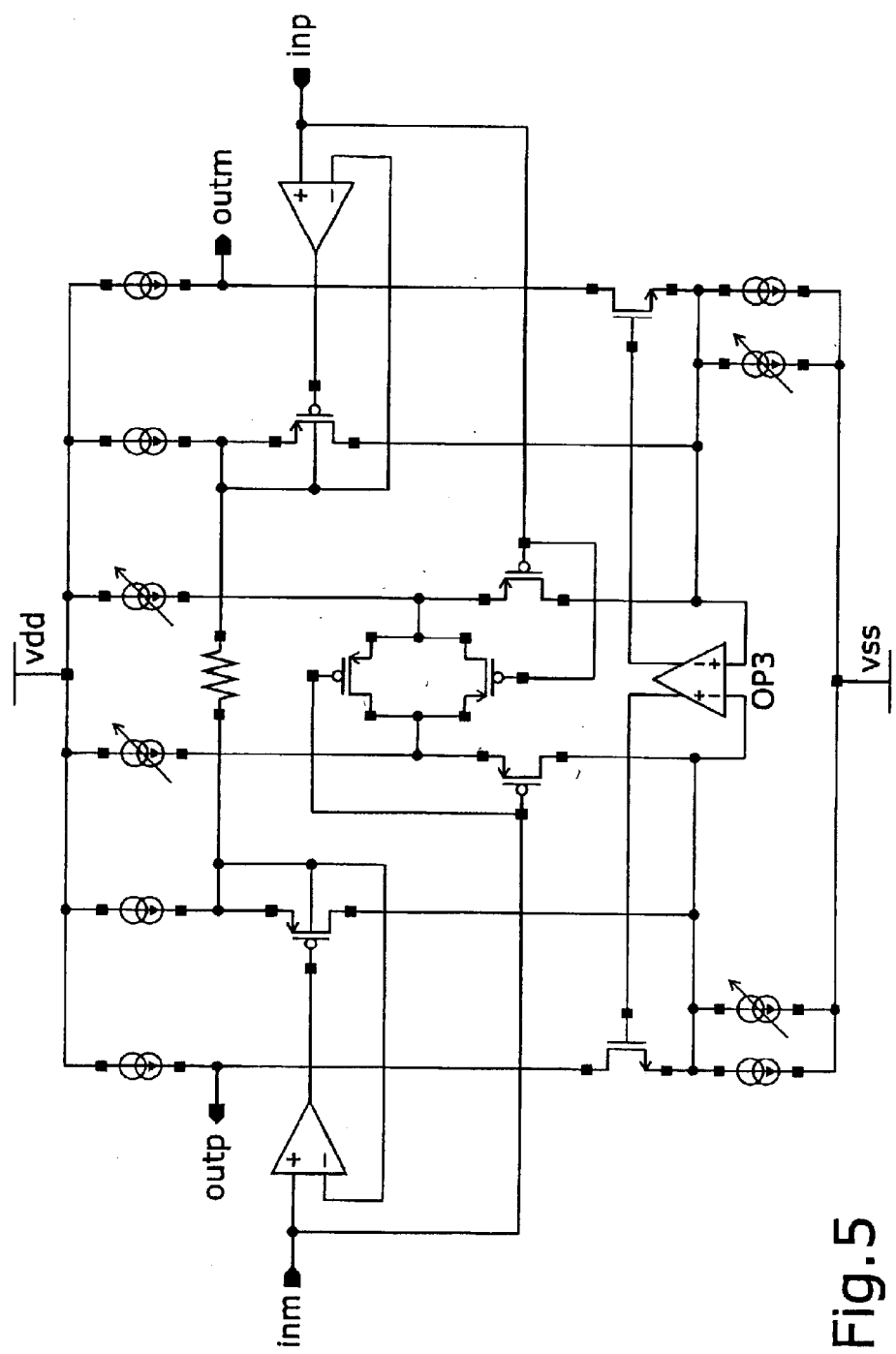
FIG. 5 shows a schematic circuit diagram of a modified embodiment of the transconductance amplifier according to FIG. 1.

FIG. 5 shows a modified embodiment of the transconductance amplifier according to FIG. 4. In contrast to the embodiment according to FIG. 4, a fully differential operational amplifier for achieving a "gain-boosting" is arranged at the current sources connected to the supply potential vss, wherein the input terminals of this operational amplifier are respectively connected to the source terminal of a cascode transistor and its output terminals are respectively connected to one of the control terminals of these cascode transistors. Due to this measure, the performance characteristics of the respective current sources are conventionally improved. This measure can also be advantageously utilized on the remaining current sources, e.g., in the form of pairs for the current sources I7, I9 and I11, I12 in FIG. 3.

Figure 6:
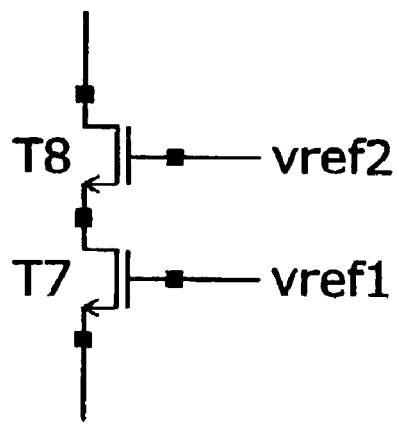
FIG. 6 shows a circuit diagram of one embodiment of a current source for use in the transconductance amplifier.

In the simplest instance, each of the current sources shown is configured as a channel of a current source transistor which is connected to one of the supply potentials, wherein a reference potential is applied to the control terminal of this current source transistor in order to define the current. This is illustrated in FIG. 6 on the example of a transistor T7, to the control terminal of which a reference potential vrefl is applied. FIG. 6 also shows that one additional current source transistor T8 may be arranged in the form of a serial connection, wherein a second reference potential vref2 is applied to the control terminal of this additional current source transistor (cascode).

Figure 7:
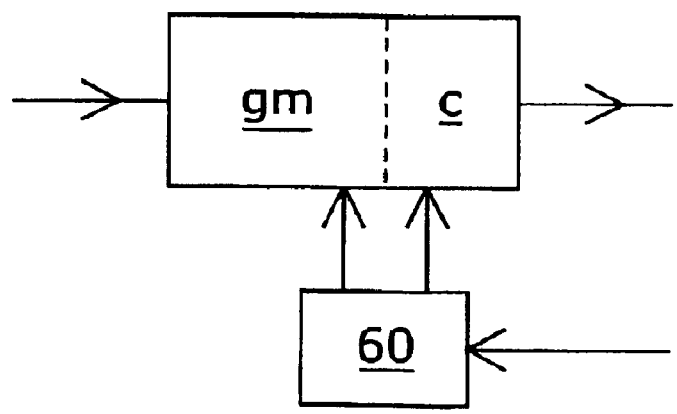
FIG. 7 shows an illustration that serves for elucidating the adjustment of a Gm/C filter.

The described circuit arrangement is particularly suitable as a functional unit of a continuous-time sigma-delta ADC, in which the rough-tuning of the filter characteristic, in particular, the individual integrator bandwidths of the filter, may be realized with the aid of switched integration capacitors and the fine-tuning may be realized by varying the individual transconductances. In this case, the transconductance can be advantageously realized by varying a current intensity in the transistor-based transconductance part of the circuit arrangement. This is illustrated in FIG. 7 on the example of a Gm/C filter that comprises a transconductance amplifier gm and a capacitor stage C, wherein measuring variables are fed to an adjusting device 60, and wherein said device 60 delivers a rough-tuning signal to the capacitor stage C and a fine-tuning signal to the transconductance amplifier gm in order to adjust the filter characteristic in the desired fashion.

What is claimed is:

1. An integrated circuit arrangement, in particular, in accordance with the CMOS technology, with at least one transconductance amplifier (1) in order to generate a current signal (outp, outm) from an input voltage signal (inp-inm), wherein the transconductance amplifier comprises a first transconductance stage (gm1) and a second transconductance stage (gm2) that are connected in parallel, with the input (p1, m1) of the first transconductance stage being connected to the input (p2, m2) of the second transconductance stage and the output (op1, om1) of the first transconductance stage being connected to the output (op2, om2) of the second transconductance stage, wherein the first transconductance stage (gm1) has a transconductance that is essentially defined by an ohmic resistance (R), with the second transconductance stage (gm2) having an adjustable transconductance that is essentially defined by a transistor arrangement (T), and wherein the transconductance of the first transconductance stage (gm1) is higher than the transconductance of the second transconductance stage (gm2).

2. The integrated circuit arrangement according to claim 1, in particular, with a symmetrically configured transconductance amplifier (1) that comprises a first input terminal for inputting a first input potential (inp) and a second input terminal for inputting a second input potential (inm), with the difference between the input potentials (inp-inm) representing the voltage signal, and with the symmetrically configured transconductance amplifier comprising a first output terminal and a second output terminal for outputting the current signal (outp, outm).

3. The integrated circuit arrangement according to claim 2, wherein the first and/or at the second transconductance stage (gm1; gm2) comprise(s):

a pair of current paths on the output side which respectively extend from a first supply potential (vdd) of the circuit arrangement to a second supply potential (vss) of the circuit arrangement and are respectively realized in the form of two current sources (I1, I2 and I3, I4; I7, I8 and I9, I10) that are connected in series, with an output node (K1, K2; K3, K4) respectively being situated between the two current sources (I1, I2 and I3, I4; I7, I8 and I9, I10) of one of the two current paths on the output side, and with these two output nodes (K1, K2; K3, K4) respectively being connected to one of the output terminals, and a pair of current paths on the input side which respectively extend from a same supply potential (vdd) of the supply potentials (vdd, vss) to one of the two output nodes (K1, K2; K3, K4) and, beginning at this supply potential (vdd), are respectively realized in the form of one additional current source (I5, I6; I11, I12) and one channel of a transistor (T1, T2; T3, T4) which are connected in series, with one input node (L1, L2; L3, L4) respectively being situated between the additional current source (I5, I6; I11, I12) and the channel of the transistor (T1, T2; T3, T4) of one of the two current paths on the input side, with the two transistors (T1, T2; T3, T4) respectively containing a control terminal, with potentials respectively being applied to these two control terminals in dependence on one of the two input potentials (inp, inm), and with the ohmic resistance (R) and the transistor arrangement (T) respectively being connected between the two input nodes (L1, L2; L3, L4).

4. The circuit arrangement according to claim 3, wherein the transistors (T1, T2) of the transconductance stage (gm1) are realized in the form of MOS-FETs, substrate terminals of which are respectively connected to one of the input nodes (L1, L2).

5. The circuit arrangement according to claim 3, wherein the first transconductance stage (gm1) contains a pair of operational amplifiers (OP1, OP2), the non-inverting inputs (+) of which are respectively connected to one of the input terminals, the outputs of which are respectively connected to one of the control terminals of the transistors (T1, T2), and the inverting inputs (−) of which are respectively connected to one of the input nodes (L1, L2) in order to apply the input potentials (inp, inm) to the input nodes.

6. The circuit arrangement according to claim 3, wherein the transistor arrangement (T) of the second transconductance stage (gm2) is formed by a transistor pair (T5, T6) that is connected in parallel, wherein a first common channel terminal of this transistor pair is connected to one (L3) of the input nodes (L3, L4) and the other common channel terminal is connected to the other (L4) of the two input nodes (L3, L4), and wherein the control terminals of the transistor pair (T5, T6) are respectively connected to one of the control terminals of the transistors (T3, T4) on the input side.

7. The circuit arrangement according to claim 3, wherein several (I11, I8, I12, I10) of the current sources of the second transconductance stage (gm2) are adjustable in order to vary the respective currents flowing through the channel of the transistors (T3, T4) of the second transconductance stage (gm2) and thusly adjust the transconductance.

8. The circuit arrangement according to claim 3, wherein at least one pair of current sources of one pair of current paths is respectively formed by one channel of a current source transistor (T7), to the control terminal of which a reference potential (vref1) is applied.

9. The circuit arrangement according to claim 8, wherein one channel of a second current source transistor (T8) is connected in series to the channel of the current source transistor (T7), wherein a second reference potential (vref2) is applied to the control terminal of the second current source transistor.

10. The circuit arrangement according to claim 9, wherein a fully differential operational amplifier is provided in order to generate the second reference potential (vref2), wherein the input terminals of this operational amplifier are respectively connected with one intermediate node between the channels of the first and the second current source transistor (T7, T8), and wherein the output terminals of said operational amplifier are respectively connected to one of the control terminals of the second current source transistor (T8).

11. An integrated circuit arrangement according to claim 1, with a capacitor stage comprising at least one capacitor for integrating the output signal of the transconductance amplifier being arranged downstream of the transconductance amplifier in order to form a Gm/C filter.

12. The circuit arrangement according to claim 9, wherein an adjusting device that is suitable for adjusting the transconductance of the second transconductance stage (gm2) is assigned to the Gm/C filter.

13. The circuit arrangement according to claim 12, wherein the adjusting device is realized such that an initial adjustment of the bandwidth of the Gm/C filter is realized by switching the capacitors of the capacitor stage on and off in stages and a second adjustment of this bandwidth is realized by adjusting the transconductance of the second transconductance stage (gm2) in an infinitely variable fashion.

14. The circuit arrangement according to claim 13, wherein the initial adjustment of the bandwidth serves as a rough-tuning process and the second adjustment of the bandwidth serves as a fine-tuning process.

15. The circuit arrangement according to claim 11, wherein the Gm/C filter is intended for an ADC.

* * * * *